(12) United States Patent
Besse et al.

(10) Patent No.: US 9,438,031 B2
(45) Date of Patent: Sep. 6, 2016

(54) ELECTROSTATIC DISCHARGE PROTECTION CIRCUIT ARRANGEMENT, ELECTRONIC CIRCUIT AND ESD PROTECTION METHOD

(75) Inventors: Patrice Besse, Tournefeuille (FR); Jerome Casters, Toulouse (FR); Jean-Philippe Laine, Cugnaux (FR); Alain Salles, Ramonville St Agne (FR)

(73) Assignee: Freescale Semiconductor, Inc., Austin, TX (US)

( * ) Notice: Subject to any disclaimer, the term of this patent is extended or adjusted under 35 U.S.C. 154(b) by 145 days.

(21) Appl. No.: 14/379,908

(22) PCT Filed: Feb. 29, 2012

(86) PCT No.: PCT/IB2012/000543
§ 371 (c)(1),
(2), (4) Date: Aug. 20, 2014

(87) PCT Pub. No.: WO2013/128227
PCT Pub. Date: Sep. 6, 2013

(65) Prior Publication Data
US 2015/0049406 A1 Feb. 19, 2015

(51) Int. Cl.
*H02H 3/22* (2006.01)
*H02H 9/02* (2006.01)
(Continued)

(52) U.S. Cl.
CPC ............... *H02H 9/02* (2013.01); *H02H 9/042* (2013.01); *H01L 27/0266* (2013.01); *H02H 9/046* (2013.01); *H02M 7/5387* (2013.01); *H05K 1/0259* (2013.01)

(58) Field of Classification Search
USPC .................................................... 361/56, 111
See application file for complete search history.

(56) References Cited

U.S. PATENT DOCUMENTS 6,650,165 B1 11/2003 Mallikarjunaswamy
2009/0021873 A1* 1/2009 Spode ................. H01L 27/0255
361/56
(Continued)

FOREIGN PATENT DOCUMENTS

JP 57-093044 U 6/1982
JP 1988-127152 U 8/1988
(Continued)

OTHER PUBLICATIONS

International Search Report and Written Opinion correlating to PCT/IB2012/000543 dated Nov. 28, 2012.

*Primary Examiner* — Danny Nguyen

(57) ABSTRACT

An electrostatic discharge, ESD, protection circuit arrangement is connectable to a first pin and a second pin of an electronic circuit and arranged to at least partly absorb an ESD current entering the electronic circuit through at least one of the first pin or the second pin during an ESD stress event. The protection circuit arrangement comprises a first ESD protection circuit arranged to absorb a first portion of the ESD current during a first part of the ESD stress event during which first part a level of the ESD current exceeds a predetermined current threshold; and a second ESD protection circuit arranged to absorb a second portion of the ESD current, the second portion having a current level below the current threshold, at least during a second part of the ESD stress event. The second ESD protection circuit comprises a current limiting circuit arranged to limit a current through at least a portion of the second ESD protection circuit to the current threshold.

19 Claims, 5 Drawing Sheets

(51) Int. Cl.
*H02M 7/5387* (2007.01)
*H05K 1/02* (2006.01)
*H01L 27/02* (2006.01)
*H02H 9/04* (2006.01)

(56) References Cited

U.S. PATENT DOCUMENTS

2010/0118454 A1* 5/2010 Ker .................. H01L 27/0262
361/56
2011/0032648 A1* 2/2011 Darthenay .......... H01L 27/0259
361/56
2013/0279051 A1* 10/2013 Gill .................... H02H 9/041
361/56
2016/0013638 A1* 1/2016 Glas ................... H02H 9/04
361/56

FOREIGN PATENT DOCUMENTS

| | | |
|---|---|---|
| JP | 1992-326768 A | 11/1992 |
| JP | 2002-271183 A | 9/2002 |
| WO | 2009/153627 A1 | 12/2009 |

* cited by examiner

US 9,438,031 B2

ELECTROSTATIC DISCHARGE PROTECTION CIRCUIT ARRANGEMENT, ELECTRONIC CIRCUIT AND ESD PROTECTION METHOD

FIELD OF THE INVENTION

This invention relates to an electrostatic discharge protection circuit arrangement, an electronic circuit and an electrostatic discharge, ESD, protection method.

BACKGROUND OF THE INVENTION

Electrostatic discharge (ESD) is a sudden, usually unwanted, current that can flow between objects, such as electronic circuits or devices, at different potentials due to the discharge of static charge of an object. ESD events can, for example, be caused by static electricity, for instance due to tribocharging. Another cause of ESD is electrostatic induction, which can occur when an electrically charged object is placed near a conductive object isolated from ground. The charged object causes an electrostatic field. This electrostatic field can then cause a redistribution of electrical charges on the surface of the conductive object.

ESD typically occurs during a short period of time and often causes a high current during this period of time which can be referred to as an ESD stress event. Thus, ESD can result in immediate, permanent damage of the electronic circuit or can cause performance degradation of the circuit.

Electronic circuits are typically required to sustain, at least to a certain extent, ESD stress events without damage to the electronic circuit. ESD sustainability of an electronic circuit can be measured according to standards dedicated to an intended field of application of the electronic circuit. ISO10605 by the International Organization for Standardization, for example, is a standard dedicated mainly to road vehicles, that defines stress test methods for electrical disturbances from electrostatic discharge, which are applicable to automotive electronic modules and vehicles. IEC61000-4-2 by the International Electrotechnical Commission is another example of standard that describes testing and measurement techniques of devices submitted to electrostatic discharge immunity test, that are applicable to electrical or electronic equipment.

To reduce or avoid a negative impact of the ESD current on the electronic circuit, ESD protection circuits can be used. The ESD protection circuit can be designed to sustain the ESD event without damage, or to be damaged instead of the electronic circuit protected by the ESD protection circuit. ESD protection circuits can for example, at least partially, absorb the ESD current. This can, for example, be achieved by diverting the ESD current away from the ESD sensitive circuits, e.g., into ground or the substrate, and/or by transforming electrical energy of the discharge into, for example, thermal energy by the protection circuit.

Another way of absorbing is, for example, to transform the energy into field energy by loading a capacitor. An electrostatic discharge between two pins, i.e. two input/output terminals of the electronic circuit, can, for example, be absorbed by a large external capacitor connected between the pins. However, this requires an additional external discrete element to be connected to the pins.

SUMMARY OF THE INVENTION

The present invention provides an electrostatic discharge protection circuit arrangement, an electronic circuit and an ESD protection method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary, as illustrated, for the understanding and appreciation of the underlying concepts of the present invention and in order not to obfuscate or distract from the teachings of the present invention.

Figure 1:
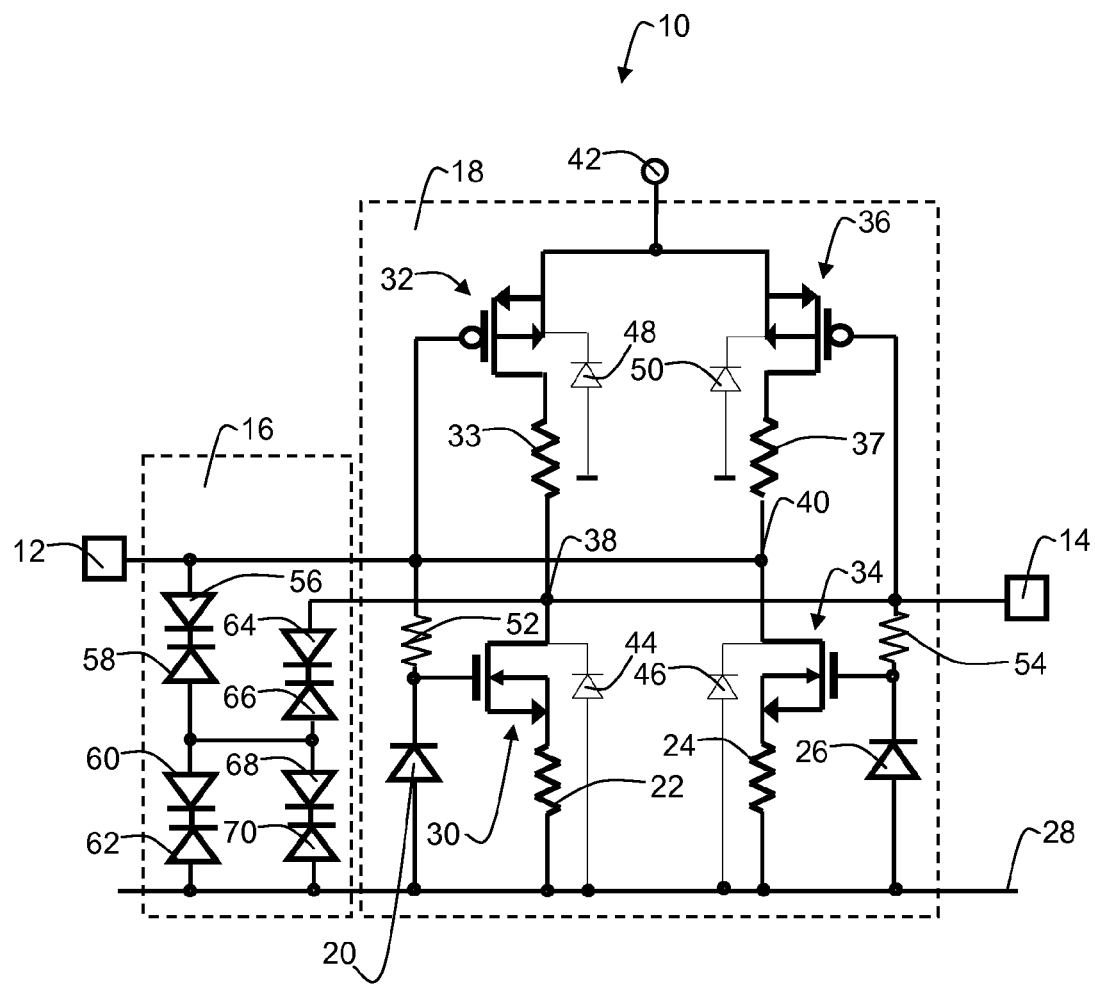
FIG. 1 schematically shows a circuit diagram of an example of an embodiment of an electrostatic discharge protection circuit arrangement.

Referring to FIG. 1, an example of an embodiment of an electrostatic discharge (ESD) protection circuit arrangement 10 is schematically shown. The protection circuit arrangement 10 is connectable to a first pin 12 and a second pin 14 of an electronic circuit 90. The electrostatic discharge protection circuit arrangement 10 shields at least a portion of the electronic circuit from ESD current entering the electronic circuit through at least a first 12 or a second pin 14 during an ESD stress event. The ESD protection circuit arrangement 10 is arranged to at least partly absorb the ESD current. The electrostatic discharge protection circuit arrangement 10 may be arranged to absorb the ESD current at least partly. It may, for example, be arranged to absorb the ESD current completely or at least to such an extent that the electronic circuit to be protected may sustain the unabsorbed current portion without permanent damage.

The electrostatic discharge protection circuit arrangement 10 may be designed to protect the electronic circuit 90 against repetitive ESD stress and not break-down due to the ESD stress. The electrostatic discharge protection circuit arrangement 10 may be arranged to absorb ESD current during a multitude of ESD stress events without damage to the arrangement 10.

It should be noted that an ESD stress event may be any period of time during which an ESD current is received at the first 12 or the second pin 14. The ESD current may have a constant current level or a variable level during the ESD event. The ESD event may, for example, comprise the first and second part. For example, the ESD current level may, for example, be very high during the first part of the ESD event, e.g. multiple times the current threshold, and may be lower during the second part of the ESD event, for example below the current threshold. The ESD current may, for example, comprise a current peak during the first part of the ESD event, followed by a fast decline and a relatively long second part, the second part having duration of multiple times the duration of the first part. It should be noted that first and second portion may, or may not, refer to a timely order of the portions. An ESD stress event may also comprise more than two part of the ESD events, for example, with one or more additional current peaks.

In the example of FIG. 1, the ESD protection circuit arrangement 10 comprises a first ESD protection circuit 16 and a second ESD protection circuit 18. The first ESD protection circuit 16 is arranged to absorb a first portion of the ESD current during a first part 84 of the ESD stress event, during which a level of the ESD current exceeds a predetermine current threshold. The second ESD protection circuit 18 is arranged to absorb a second portion of the ESD current at least during a second part of the ESD stress event. The second portion has a current level below the current threshold. As shown, the second ESD protection circuit 18 comprises a current limiting circuit 20, 22, 24, 26 arranged to limit a current through at least a portion of the second ESD protection circuit 18 to the current threshold.

During the ESD stress event, the received ESD current may be diverted in the first and second ESD protection circuits 16, 18, thereby protecting the electronic circuit connected to the first and second pin 12, 14. The first ESD protection circuit 16 may absorb at least a part of the current peak during the first part of the ESD event, while the second ESD protection circuit is switched off or the current in the second ESD protection circuit 18 is limited by the current limiting circuit. During the second part of the ESD event, the components of the second ESD protection circuit 18 may absorb the ESD current, at least partially or completely, and thermal defects in the first ESD protection circuit 16 can be limited or avoided. Accordingly, on the one hand the first ESD protection circuit protects the second ESD protection circuit for damage from ESD current above the current threshold, while the second ESD protection limits avoids thermal damage to the first ESD protection circuit.

The electrostatic discharge protection circuit arrangement 10 thus allows a fully integrated ESD protection without requiring an external capacitor between the pins, and to pass ESD system level stress, such as ESD system level stress according to ISO10605 test procedure, which may comprise applying the stress between the two pins 12, 14, with none of the pins being grounded.

The first ESD protection circuit 16 and the second ESD protection circuit 18 may absorb the ESD current in any manner suitable for the specific implementation. For example, the second ESD protection circuit 18 may be arranged absorb a portion of the ESD current during an ESD stress event not only during the second part of the ESD event but anytime, including during a part of the first part of the ESD event, the absorbed current portion is below the current threshold.

Also, both the first and second ESD protection circuits 16, 18 may absorb simultaneously a part of the ESD energy during the ESD stress event, thereby preventing each other from damage. For example, the first and second ESD protection circuits 16, 18 may be arranged such that in case of an ESD current peak, the second protection circuit absorbs a part of the ESD current up to the current threshold and first protection circuit 16 absorbs the remaining part of the ESD current, e.g. equal the difference between the total ESD current and the current absorbed by the ESD second protection circuit 18. Also, during the second part of the ESD event the first ESD protection circuit 16 may absorb a part of the ESD current as well.

Furthermore, the first ESD protection circuit 16 may start to absorb current only when the ESD current reaches, or exceeds, the current threshold of the second ESD protection circuit. Alternatively, the first ESD protection circuit 16 may be arranged to switch from off state to on state, i.e., may start to absorb current at another point in time, for example based on another current threshold, which may be below or equal to the current threshold applied to the second ESD protection circuit 18.

The first ESD protection circuit 16 may for example be arranged to sustain the expected peak ESD current level but only for a short period of time e.g. corresponding to the expected duration of the ESD peak, whereas the second ESD protection circuit 18 may comprise components, for example power devices, such as power transistor devices, not able to sustain the expected peak ESD but arranged to sustain an lower ESD current for a longer time, e.g. once the ESD current level is found below the current threshold. This may enable a reliable, safe and compact implementation of the electrostatic discharge protection circuit arrangement 10 in the same integrated circuit, e.g. on the same die, as the electronic circuit to be protected without a significant increase in required die size. The first ESD protection circuit 16 may, for example, be arranged to absorb, during the first part of the ESD event of the ESD stress event, a current comprising a maximum level at least twice as high as the current threshold, or it may, for a short time, absorb an even higher, e.g. five times higher current.

The second ESD protection circuit 18 may be implemented in any manner suitable for the specific implementation. For example, as shown in FIG. 1, the second ESD protection circuit 18 may comprise a bridge circuit. A bridge circuit may be a circuit with two circuit branches and with a third branch serving as a bridge between the two circuit branches at intermediate nodes. The bridge circuit may be connected between a voltage supply Vsup 42 and a reference potential 28, such as ground GND. The bridge circuit may be a full bridge circuit, i.e. it may comprise at least two devices within each circuit branch, a first one connected to the voltage supply 42 and a second one connected to the reference potential 28 and connected to each other, through the third branch, at an intermediate node between the first device and the second device. As shown, the third branch may further be connected to the first and second pins 12, 14 and the first ESD protection circuit 16.

If the set of devices of each branch have identical or very similar element parameters as the set of the other branch, the second portion of the ESD current may be equally distributed over the two branches, thereby absorbing the current without requiring one of the devices to sustain a higher ESD current density than the others. A symmetrical second ESD protection circuit 18 topology may also allow for bidirectional usage of the second ESD protection circuit 18 while providing the same or very similar current sustainability characteristics independently from whether the ESD current is received through the first pin 12 or the second pin 14.

The bridge circuit may e.g. comprise one or more switching elements 30, 32, 34, 36, each comprising a switching terminal and two channel terminals. The switching elements 30, 32, 34, 36 may be any suitable type of switching element, such as semiconductor devices, for example transistors. The transistors may, for example, be field-effect transistor (FET) devices, such as metal oxide semiconductor (MOS) FETs. For example, as shown in FIG. 1, the first and third switching elements 30, 34 may be N-channel MOSFETs and the second and fourth switching elements 32, 36 may be P-channel MOSFETs. The switching terminal may e.g. be formed by the gate of a FET and the channel terminals be formed by the source and drain of the FET. However, other types of transistor may be used as well such as, for example, bipolar transistors or other FETs, such as junction gate field-effect (JFET) transistors or high electron mobility transistors (HEMT), Insulated Gate Bipolar Transistor (IGBT) as well as transistor devices comprising more than one transistor, for example, complementary MOS (CMOS) devices. The transistor devices may, for example, be power transistor devices arranged to sustain high current density and high power dissipation.

As shown in FIG. 1, the switching elements 30, 32, 34, 36 may comprise intrinsic parasitic diodes 44, 46, 48, 50 that may carry or absorb ESD current, for example, divert ESD current to the substrate at reference potential 28 by the first ESD protection circuit 16. Bulk technologies with oxide isolation, may reduce the impact of parasitic devices.

The bridge circuit may, for example, comprise at least four switching elements. As shown in FIG. 1, a first branch may, for example, comprise first and second switching elements 30, 32, connected in series between a voltage supply 42 and a reference potential 28. A second branch may comprise third and fourth switching elements 34, 36, connected in series between the voltage supply 42 and the reference potential 28. Resistive elements 33, 37 may be connected to the second and fourth switching elements 32, 36 for protection from a first ESD current peak and for additional ESD current consumption. The third branch may be connected at intermediate nodes 38, 40 between the switching elements of respectively the first and second branch.

The two channel terminals of each of the one or more switching elements 30, 32, 34, 36 may be connected to direct at least a part of the second portion of the ESD current through the corresponding switching device. The respective switching terminal may be connected to receive a control signal and, in response to the control signal, reduce or interrupt a current flow between the two channel terminals within the corresponding switching elements. The switching terminal may, for example, receive the control signal from the current limiting circuit.

The current limiting circuit 20, 22, 24, 26 may implemented in any manner suitable for the specific implementation and, as the example of FIG. 1, for example be arranged to control conductivity between the two channel terminals of at least one of the switching elements in response to the ESD current. As shown, a current limiting circuit may be connected to the control terminal of the respective switching element 30, 34 and enable current flow between first and second channel terminals only if a level of received ESD current is below the current threshold and inhibit or limit current flow if the received ESD current reaches or exceeds the current threshold. The current threshold is defined by the parameters of the members of the current limiting circuit, and, as in the example, may be individually set for one for each of the switching element, and for example be set to the current limit, the respective switching element can sustain without damage.

As shown in FIG. 1 for low side (i.e. reference potential side) switching elements 30, 34 of the branches, the current limiting circuit may comprise a diode or other clamping structure 20, 26 connected with the cathode to the control terminal and the anode to a reference node 28, and a resistive element 22, 24 connected between one of the channel terminals and the reference node 28. The current limiting circuit may for example be implemented as described in International Patent application publication WO2009/153627. The resistance of the resistive elements 22, 24 may be selected such that when the current flowing through the switching element 30, 34 between the first and second channel terminals exceeds the current threshold, the voltage drop across the resistive element 22, 24 exceeds a difference between (i) a clamping voltage of the clamping structure and (ii) a switching voltage threshold of the at least one switching element, thereby causing the impedance between the first and second channel terminals of the at least one switching component to increase and the current flowing through the respective low side switching element to be limited, and accordingly the current flowing through the branch which comprises the respective switching element.

The current limiting circuit may comprise additional resistive elements 52, 54 connected between the control terminal of the low side switching elements 30, 32, and the first and second pin 12, 14, respectively. Their resistances may be high in order to protect the switching elements 30, 34 during the ESD event, especially the control terminal, such as the gate oxide in case of a FET.

The first ESD protection circuit 16 may be implemented in any manner suitable for the specific implementation. The first ESD protection circuit 16 may for example divert a current peak, which may, for example, be shorter than 100 ns, while the current in the switching elements 30, 32, 34, 36 of the second ESD protection circuit 18 is limited to the current threshold by the current limiting circuit.

Figure 3:
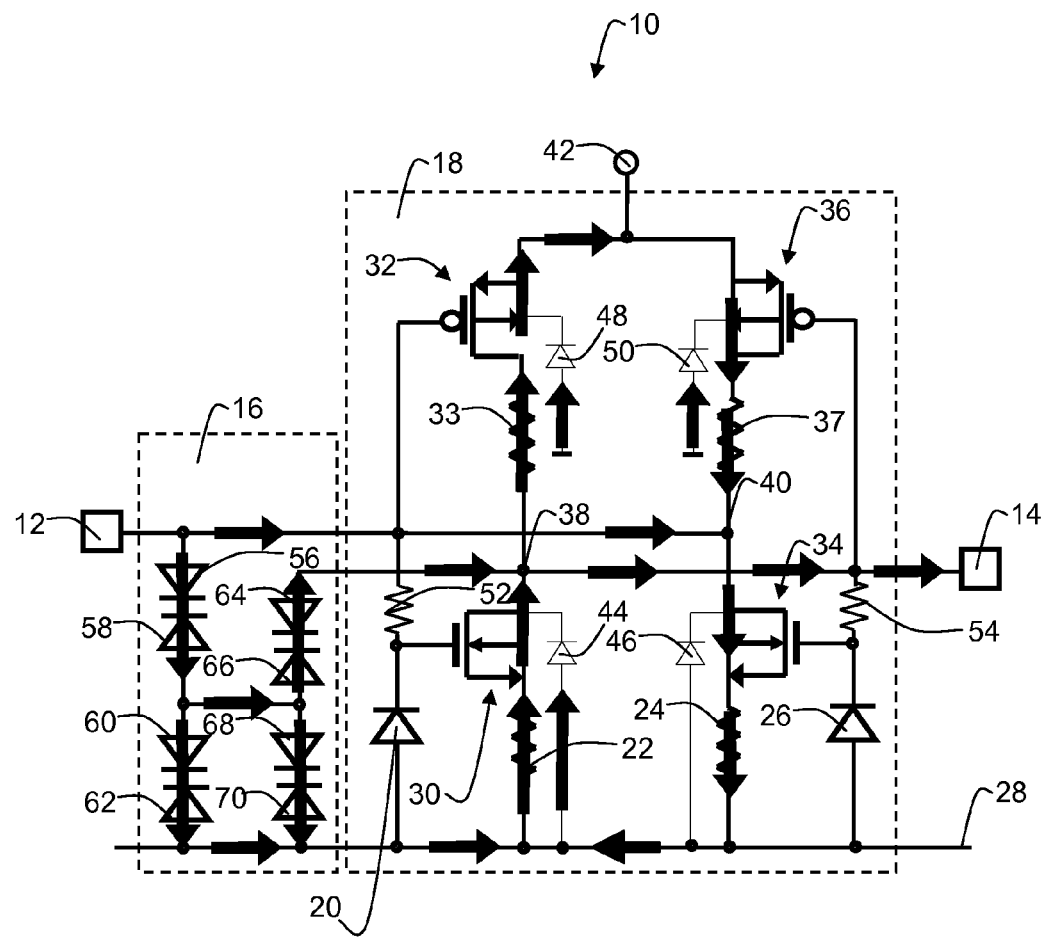
FIG. 3 schematically shows the example of FIG. 1 with current paths during an ESD stress event indicated.

The shown first ESD protection circuit 16 comprises a plurality of current paths through which the ESD current flows during the first part of the ESD event of an ESD stress event. FIG. 3 schematically the current paths, indicated by bold arrows, during an ESD stress event of the example of FIG. 1. The plurality of ESD protection structures may provide multiple current paths and may be connected to at least partly divert the first portion of the ESD current between the ESD protection structures. The shown topology may help reduce the particular ESD current density at each of the ESD protection structures of the multiple current paths to a level that each structure may sustain at any time with reduced or without damage. As shown in FIG. 3, where the arrows indicated the flow of current during the first part of the ESD event when the ESD current exceeds the threshold current, the first ESD protection circuit 16 and second ESD protection circuit 18 provide multiple current paths through the ESD protection structures and switching elements of the first ESD protection circuit 16 and second ESD protection circuit 18 and may divert the ESD current received at one of the pins through all the devices and into the other of the pins, and, for example, also into the substrate and the voltage supply 24. With these optimized current paths, robustness against ESD may be achieved.

Like the second ESD protection circuit 18 of this example, the first ESD protection circuit 16 may be operable in both directions. As shown in FIG. 1, the plurality of ESD protection structures may be connected to provide a symmetrical structure relative to the first and second pin 12, 14, giving a bidirectional circuit topology. Thus, ESD current received either from the first 12 or second pin 14 may be treated in the same way in case of symmetrical circuitry. At least some of the plurality of ESD protection structures

56,58; 60,62; 64,66; 68,70 may be arranged as a bidirectional circuitry connectable to the first 12 and second pin 14.

Figure 2:
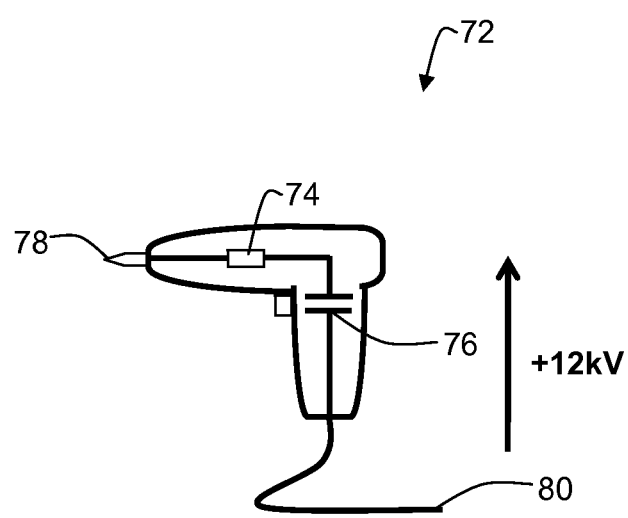
FIG. 2 schematically shows a schematic side view of an example of an ESD stress test device.

The first directional ESD protection structures 56, 60, 64, 68 and second directional ESD protection structures 58, 62, 66, 70 may be responsive to symmetrical triggering voltages for starting conducting ESD current. Symmetrical triggering voltages may have the same absolute value and opposite signs, i.e., the first directional ESD protection structures 56, 60, 64, 68 may be responsive to first triggering voltages and the second directional ESD protection structures 58, 62, 66, 70 may be responsive to second triggering voltages having the same absolute value and opposite signs as compared to the first triggering voltages. For example, in order to sustain an ESD discharge generated by an ESD stress test device as shown in FIG. 2 preliminary charged to 12 kV, which current peak may reach 45 A, according to an ISO10605 test, the ESD protection structures may have trigger voltages of about 20 V. The trigger voltage may be different or the same for each pair of directional ESD protection structures. The trigger voltage may be at an absolute level sufficiently high to ensure that the ESD protection structures only conduct ESD current during the first part of the ESD event, e.g. the ESD current peak such as period 84 in FIG. 4 and do not conduct ESD current during the second part of the ESD event, e.g. period 86 indicted in FIG. 4.

As shown in the example of FIG. 1, the first ESD protection circuit 16 may have a bridge structure. In this example, the bridge comprises a first branch 56,58,60,62 which connects the first pin 12 to the reference voltage potential 28, a second branch 64,66,68,70 which connects the second pin 14 to the reference voltage potential 28, and a bridging connection which forms a third branch between the two branches.

The first ESD protection circuit 16 may, for example, comprise a plurality of ESD protection structures 56, 58; 60, 62; 64, 66; 68, 70. An ESD protection structure may, for example, be a directional ESD protection structure, i.e. which exhibits a reverse or blocking direction and a conducting or forward direction for carrying current flow. The ESD protection structure may be formed by one or more MOS or bipolar devices. It may, for example, be a diode, a thyristor, a silicon controlled rectifier (SCR) or other intrinsically directional structure.

As shown, the plurality of ESD protection structures may comprise one or more pairs 56,58;60,62;64,66;68,70 respectively, of first directional ESD protection structures and second directional ESD protection structures. In each pair, the first directional ESD protection structure and the second directional ESD protection structure are connected to each other with the forward directions in opposite. As shown in FIG. 1, the pairs of first and second directional ESD protection structures may, for example, be pairs of diodes, wherein one or more of the pairs, e.g., all pairs, may have their cathode terminals connected. In another embodiment, anode terminals instead of cathode terminals may be connected. In the example of FIG. 1, the first branch and the second branch both comprise two pairs in series, and the bridging connection is provided at the intermediate node between the two pairs in each branch.

Referring to FIG. 2, an example of an ESD stress test device 72 is schematically shown. It comprises a resistor 74, e.g. having a resistance of more than 1 kΩ, 2 kΩ for example, and a capacitor 76, e.g. having a capacitance of several pF, such as 330 pF. In order to carry out an ISO 10605 compliant ESD gun stress test, a first terminal 78 and a second terminal 80 may be connected to the first and second pins 12, 14. The ESD stress test device 72 may, for example be used to apply an ESD zap to the ESD protection circuit arrangement 10 shown in FIG. 1, with a current peak of 45 A generated by the discharge of a capacitance preliminary charged to 12 kV according to ISO 10605.

Figure 4:
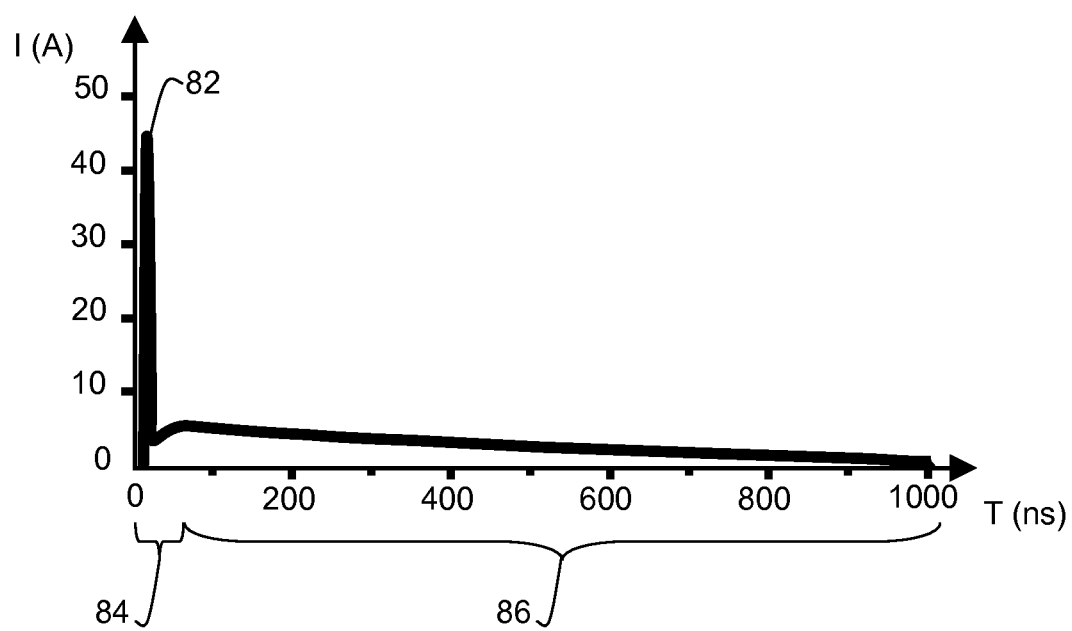
FIG. 4 shows an example of a graph of the discharge current as a function of time during an ESD stress event.

Referring to FIG. 4, an example of a diagram of current discharge over time during an ESD stress event is shown, against which the ESD protection circuit arrangement 10 may protect an electronic circuit. The diagram may correspond to an ESD system stress according to an ISO 10605 stress test. The shown curve comprises a current peak 82 during a first part 84 of the ESD event, followed by a tail current during a second part 86 of the ESD event. In the shown example, the second part has a duration of several hundreds of nanoseconds, whereas the first part 84 has a duration of less than 50 ns. During the current peak, the ESD current reaches a maximum of between 40 A and 50 A, about 45 A in this example. During the second part, the ESD current is less than 10 A, about 5 A at the beginning of the second part with a gradual decay afterwards to less than 1 A at the end of the second part. During the second part 86 of the ESD event current may be absorbed mainly by the second ESD protection circuit. It should be noted that during the first part of the ESD event 84 the ESD current peak may be mainly diverted through the first ESD protection circuit 16, but the second ESD protection circuit 18 with current limitation may simultaneously absorb a portion of the ESD current as well.

Figure 5:
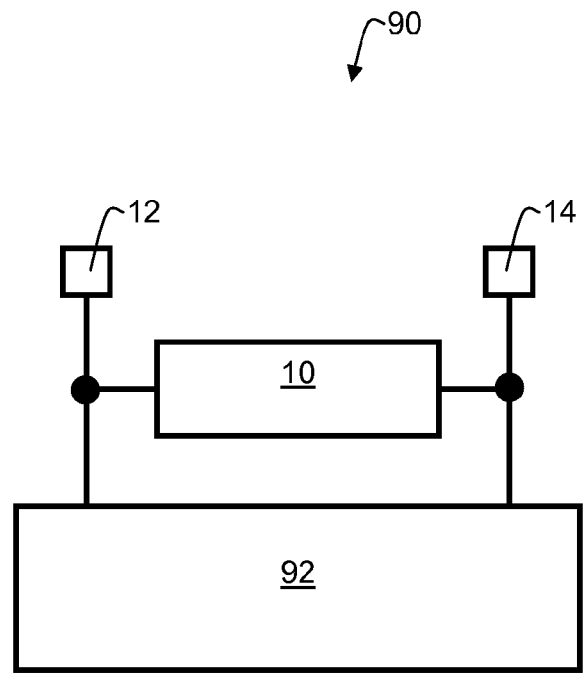
FIG. 5 schematically shows a block diagram of an example of an embodiment of an electronic circuit.

Referring to FIG. 5, a block diagram of an example of an embodiment of an electronic circuit 90 is schematically shown therein. The electronic circuit 90 may, as shown, comprise an ESD sensitive device 92. The electronic circuit 90 may further comprise at least a first pin 12 and a second pin 1 and one or more electrostatic discharge protection circuit arrangements 10, for example as shown in FIG. 1 or as described above, connected to the first 12 and second pin 14.

The electrostatic discharge protection circuit arrangement 10 may for example protect the electronic circuit from sudden high current events generated by electrostatic discharge or any other high current source, wherein high current may refer to current at a level high enough to cause damage to the electronic circuit.

Although in the example only two pins 12,14 and a single electrostatic discharge protection circuit arrangement 10 are shown, the electronic circuit may comprise more than two pins, which may be protected against ESD by one, two or more electrostatic discharge protection circuit arrangements 10. A pin generally provides an electrical connection to outside the package of an integrated circuit, and may refer to any input and/or output terminal for applying or receiving a signal to or from the electronic circuit from outside the integrated circuit. The first and second pin 12, 14 may, for example, not be connected to a reference potential, such as ground. The electrostatic discharge protection circuit arrangement 10 may be arranged to absorb ESD current entering through one pin even when it cannot be diverted to ground through a neighbouring second pin. The first and second ESD protection circuits 16, 18 may be connected to a reference potential 28, such as ground, for example, via a substrate carrying the electrostatic discharge protection circuit arrangement 10 implemented as an integrated circuit. The ESD protection circuit arrangement 10 may, for example, be located on a same integrated circuit die as the electronic circuit to be protected, or be provided on different dies located in the same integrated circuit package.

The electronic device 90 may be any suitable device, and, for example, be a safety relevant device. The device 90 may, for example, be part of a wheel speed sensor system of a vehicle. It may, for example, be comprised in a safety critical system, such as an automotive safety critical system, whose possible malfunction or wrong usage may endanger, for example, a user of the system, e.g. a car driver. A safety critical system may, for example, be part of electronic equipment of a power plant or a vehicle. A vehicle may for example be a car, a truck, a plane, a ship, a helicopter, etc. A safety critical system of a vehicle, i.e., an automotive safety critical system, may, for example, be an engine control unit (ECU). An automotive safety critical system may, for example, be a car safety system. A safety critical system may comprise systems such as airbags, a brake system or an electrical steering system. A brake system may comprise, for example, an anti-lock braking system (ABS), an electronic brakeforce distribution system (EBD), a cornering brake control (CBC) system etc. An electrical steering system may comprise, for example, an electronic stability control system (ESC), a traction control system (TCS) or anti-slip regulation system (ASR), an adaptive cruise control (ACC) system, a forward collision warning (FCW) system etc. The system may also be another type of system such as a climate control or a seat positioning system.

The presented electronic circuit 90 with the electrostatic discharge protection circuit arrangement 10 may provide a compact solution, even if the die size for integration of the electronic circuit 90 is limited. The electronic circuit 90 may be located in a single integrated circuit, for example the portion containing an ESD sensitive device 92 and the electrostatic discharge protection circuit arrangement 10 may share the same die or be provided in on different dies in a single integrated circuit package.

Figure 6:
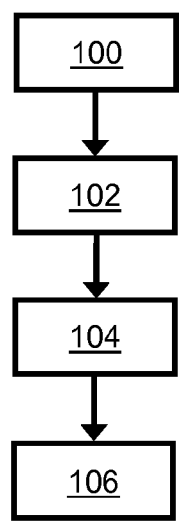
FIG. 6 schematically shows a flowchart which illustrates an example of an ESD protection method.

Referring to FIG. 6, a flow-chart an embodiment of a method for protecting at least a portion of an electronic circuit from ESD current is schematically shown. The method shown in FIG. 5 allows implementing the advantages and characteristics of the described electrostatic discharge protection circuit arrangement as part of a method for protecting at least a portion of an electronic circuit from ESD current.

The shown electrostatic discharge, ESD, protection method comprises receiving 102 at a first pin or a second of an electronic circuit an ESD current during an ESD stress event; and at least partly absorbing the ESD current by an electrostatic protection circuit arrangement connected to the first pin and the second. The at least partly absorbing comprises absorbing 104 a first portion of the ESD current by a first ESD protection circuit of the electrostatic protection circuit arrangement during a first part of the ESD event, during which first part a level of the ESD current is higher than a predetermined current threshold; and absorbing 106 by a second ESD protection circuit of the electrostatic protection circuit arrangement a second portion of the ESD current, said second portion having a current level below the current threshold, at least during a second part of the ESD stress event; and limiting 100, by a current limiting circuit, a current through at least a portion of the second ESD protection circuit to the current threshold.

The method may, for example, comprise that the stage of receiving 102 comprises receiving the ESD current during an ESD stress event according to ISO 10605 test procedure.

The method may also comprise receiving ESD currents during a sequence of the ESD stress events.

In the foregoing specification, the invention has been described with reference to specific examples of embodiments of the invention. It will, however, be evident that various modifications and changes may be made therein without departing from the broader scope of the invention as set forth in the appended claims and that the claims are not limited to the specific examples described herein above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the first and second ESD protection circuits 16, 18 may be considered as a single ESD protection circuit.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the electrostatic protection circuit arrangement 10 and the portion of the electronic circuit comprising the ESD sensitive device 92 may be located on a single integrated circuit. Alternatively, the examples may be implemented as any number of separate integrated circuits or separate devices interconnected with each other in a suitable manner. For example, the protection circuit arrangement 10 may be located as a separate integrated circuit connected to the electronic circuit to be protected.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electrostatic discharge, ESD, protection circuit arrangement, said protection circuit arrangement being connectable to a first pin and a second pin of an electronic circuit and arranged to at least partly absorb an ESD current entering said electronic circuit through at least one of the first pin or the second pin during an ESD stress event, said protection circuit arrangement comprising:
a first ESD protection circuit arranged to absorb a first portion of said ESD current during a first part of said ESD stress event during which first part a level of said ESD current exceeds a predetermined current threshold; and
a second ESD protection circuit arranged to absorb a second portion of said ESD current, said second portion having a current level below said current threshold, at least during a second part of said ESD stress event, said second ESD protection circuit comprising a current limiting circuit arranged to limit a current through at least a portion of said second ESD protection circuit to said current threshold, wherein said second ESD protection circuit comprises a bridge circuit, said bridge circuit comprising one or more switching elements, each of the one or more switching elements comprising a switching terminal and two channel terminals.

2. The electrostatic discharge protection circuit arrangement as claimed in claim 1, wherein said bridge circuit is arranged to distribute said second portion of said ESD current between a first branch and a second branch of said bridge circuit.

3. The electrostatic discharge protection circuit arrangement as claimed in claim 1, wherein said second ESD protection circuit is arranged to provide the same current sustainability characteristics independently from whether said ESD current is received through said first pin or said second pin.

4. The electrostatic discharge protection circuit arrangement as claimed in claim 1, wherein said current limiting circuit is arranged to control a conductivity between said two channel terminals of at least one of said switching elements in response to said ESD current.

5. The electrostatic discharge protection circuit arrangement as claimed in claim 4, wherein for said at least one of said switching elements said current limiting circuit comprises a clamping structure and a resistive element, arranged to cause a decrease of said conductivity between said two channel terminals of said at least one of said switching elements when a voltage drop across said resistive element exceeds a difference between a clamping voltage of said clamping structure and a switching voltage threshold of said at least one of said switching elements.

6. The electrostatic discharge protection circuit arrangement as claimed in claim 1, wherein said first ESD protection circuit comprises a plurality of ESD protection structures connected to at least partly divert said first portion of said ESD current between said ESD protection structures.

7. The electrostatic discharge protection circuit arrangement as claimed in claim 6, wherein said plurality of ESD protection structures comprises one or more pairs of first directional ESD protection structures and second directional ESD protection structures, wherein for each of said pairs said first directional ESD protection structure and said second directional ESD protection structure are connected with each other in opposite direction.

8. The electrostatic discharge protection circuit arrangement as claimed in claim 6, wherein at least some of said plurality of ESD protection structures are arranged as a bidirectional circuitry connectable to said first and second pin.

9. The electrostatic discharge protection circuit arrangement as claimed in claim 7, wherein said first directional ESD protection structures are responsive to first triggering voltages and said second directional ESD protection structures are responsive to second triggering voltages having the same absolute values and opposite signs as compared to said first triggering voltages.

10. The electrostatic discharge protection circuit arrangement as claimed in claim 1, wherein said first ESD protection circuit is arranged to absorb, during said first part of the ESD event of said ESD stress event, a current comprising a maximum level at least twice as high as said current threshold.

11. The electrostatic discharge protection circuit arrangement as claimed in claim 1, wherein the second ESD protection circuit is arranged to absorb, in addition to during the second part of the ESD event, a portion of the ESD current during an ESD stress event at least during a part of the first part of the ESD event.

12. The electrostatic discharge protection circuit arrangement as claimed in claim 11, wherein the first and second ESD protection circuits are arranged such that during the first part, the second protection circuit absorbs a part of the ESD current up to the current threshold and said first protection circuit absorbs a remaining part of the ESD current.

13. The electrostatic discharge protection circuit arrangement as claimed in claim 1, wherein during said first part said first and second ESD protection circuits provide a plurality of current paths for absorbing said ESD current.

14. The electrostatic discharge protection circuit arrangement as claimed in claim 1, wherein said first part is shorter than said second part, for example 10 times shorter.

15. The electrostatic discharge protection circuit arrangement as claimed in claim 1, wherein said first ESD protection circuit is arranged to absorb a current of at least 40 A, and said current threshold is 10 A or less.

16. An electronic circuit, comprising
at least a first and a second pin;
an ESD sensitive device; and
at least one electrostatic discharge protection circuit arrangement as claimed in claim 1, connected to said first and second pin.

17. The electronic circuit as claimed in claim 11, wherein said electronic circuit is located in a single integrated circuit package.

18. An electrostatic discharge, ESD, protection method, comprising:
receiving at a first pin or a second pin of an electronic circuit an ESD current during an ESD stress event;
at least partly absorbing the ESD current by an electrostatic protection circuit arrangement connected to the first pin and the second pin; said at least partly absorbing comprising:
absorbing a first portion of said ESD current by a first ESD protection circuit of the electrostatic protection circuit arrangement during a first part of the ESD event, during which first part a level of said ESD current is higher than a predetermined current threshold; and
absorbing by a second ESD protection circuit of the electrostatic protection circuit arrangement a second portion of said ESD current, said second portion having a current level below said current threshold, at least during a second part of said ESD stress event; and
limiting, by a current limiting circuit, a current through at least a portion of said second ESD protection circuit to said current threshold, wherein said second ESD protection circuit comprises a bridge circuit, said bridge circuit comprising one or more switching elements.

19. The method as claimed in claim 1, wherein said receiving comprises receiving said ESD current during an ESD stress event according to ISO 10605 test procedure.

* * * * *